United States Patent
Panis

(10) Patent No.: US 6,550,036 B1
(45) Date of Patent: Apr. 15, 2003

(54) PRE-CONDITIONER FOR MEASURING HIGH-SPEED TIME INTERVALS OVER A LOW-BANDWIDTH PATH

(75) Inventor: Michael C. Panis, Brookline, MA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 09/409,618

(22) Filed: Oct. 1, 1999

(51) Int. Cl.[7] .................. G06F 11/00; H03M 13/00; G06M 1/10
(52) U.S. Cl. .................. 714/815; 714/744; 714/814; 324/76.44; 324/76.59; 324/76.62; 368/113
(58) Field of Search .................. 714/744, 814, 714/815; 324/76.19, 76.11, 76.15, 76.39, 76.44, 76.47, 76.48, 76.62, 76.68, 76.59, 76.74; 368/89, 107, 113–118

(56) References Cited

U.S. PATENT DOCUMENTS

| | | | | |
|---|---|---|---|---|
| 4,362,394 A | * | 12/1982 | Menlove | 368/118 |
| 4,792,932 A | | 12/1988 | Bowhers et al. | 368/113 |
| 4,843,328 A | * | 6/1989 | Greenhall | 324/76.74 |
| 5,321,702 A | * | 6/1994 | Brown et al. | 714/744 |

* cited by examiner

*Primary Examiner*—Emmanuel L. Moise
(74) *Attorney, Agent, or Firm*—Bruce D. Rubenstein

(57) ABSTRACT

A pre-conditioner for enabling high-speed time interval measurements in an ATE system having a relatively low-bandwidth pathway between a UUT and a timer/counter includes a frequency divider and a D flip-flop located near the UUT. The frequency divider receives a first input signal from the UUT and produces a first output signal having a frequency equal to 1/N times the frequency of the first input signal. The first output signal connects over the low-bandwidth pathway to a first channel of the timer/counter. The first output signal also connects to the D input of the D flip-flop. The pre-conditioner receives a second input signal from the UUT that drives the CLOCK input of the D flip-flop. The Q output of the D flip-flop supplies a second output of the pre-conditioner. The second output connects over the low-bandwidth pathway to a second channel of the timer/counter. The time interval between successive rising edges of the output signals precisely match the time interval between successive rising edges of the input signals. Although the pre-conditioner preserves the edge locations of its input signals, the frequency of the signals it sends to the timer/counter is 1/N times the input frequency. The pre-conditioner thus enables to the timer/counter to measure closely spaced, consecutive edges of inputs over a low-bandwidth path. Multiplexors, inverters, and additional frequency dividers may be included with the pre-conditioner to enhance its functionality.

30 Claims, 5 Drawing Sheets

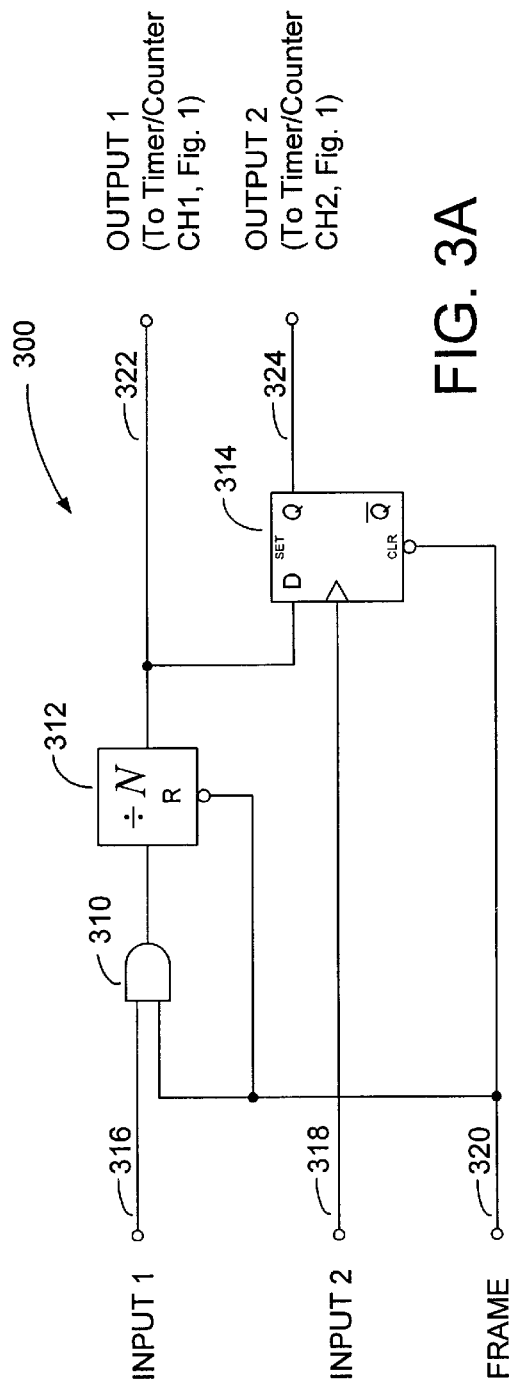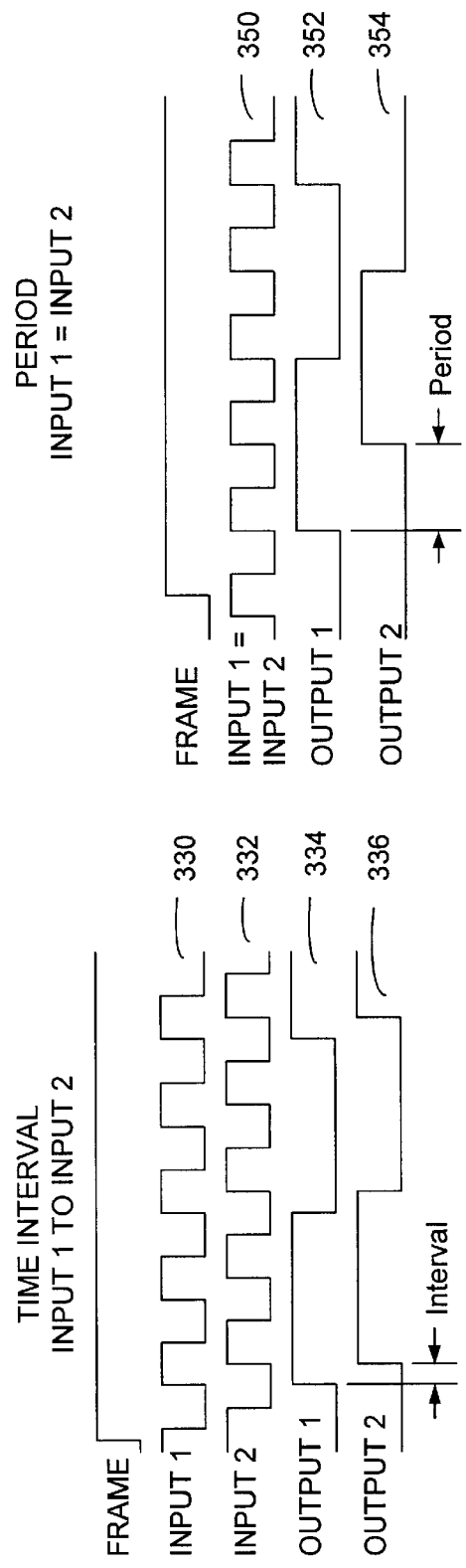
FIG. 3A
FIG. 3B
FIG. 3C

PRE-CONDITIONER FOR MEASURING HIGH-SPEED TIME INTERVALS OVER A LOW-BANDWIDTH PATH This application relates generally to electronic time measurement, and more particularly to making accurate time measurements in electronic test systems.

BACKGROUND OF THE INVENTION

Many electronic products have time-critical specifications that manufacturers verify before shipping the products to customers. Manufacturers typically use automatic test equipment (ATE) to verify these specifications.

FIG. 1A illustrates a conventional ATE configuration for testing time-critical devices. As shown in FIG. 1A, an ATE system 100 is connected to a unit under test (UUT) 120 via a plurality of channels 110 attached to test points of the UUT 120. Each channel 110 includes comparators 124 and 126 that detect timing events at the UUT. The comparators generate time-sensitive signals that change in response to the timing events at the UUT. The time-sensitive signals typically follow a long path before they reach a measurement instrument, for example as a timer/counter 118. The signals pass through a first signal pathway 112 to a multiplexor 114. The multiplexor selects a pair of signals from one of the plurality of channels 110. The selected signals pass through a second signal pathway 116 and on to the timer/counter 118.

A timer/counter typically determines time intervals by measuring the delay between first and second signal edges, designated as a "start" event and a "stop" event. The start event initiates the time measurement, and the stop event terminates the time measurement. The start and stop events are typically provided at CH1 and CH2 of the timer/counter, respectively.

FIG. 1B shows the appearance of test signals that originate at the UUT 120, at opposite points along the signal pathway between the channels 110 and the timer/counter 118. Waveform 132 depicts an ideal, rectangular test signal as it emerges from a channel 110. Waveform 124 shows the same signal as it arrives at the timer/counter 118. In contrast with the rectangular, steep-edged signal 132 at the output of the channel, the signal 134 reaching the timer/counter is slow and distorted, and its amplitude is reduced. It would be difficult for the timer/counter 118 to determine accurately the timing characteristics, for example the pulse width, of the initial signal 132 by measuring the arriving signal 134. Unlike the initial signal 132, wherein pulse width is constant, the pulse width of the arriving signal 134 varies with the threshold voltage applied. As pulse width shortens, so too does the height of the pulse at signal 134. Eventually, the pulse height becomes so short that the timer/counter cannot respond.

Another way in which the signal path between the channels 110 and the timer/counter 118 distorts test signals is by differentially delaying rising and falling edges. For example, if the signal path delays falling edges more than it delays rising edges, the signal path will erroneously lengthen positive pulse widths and shorten negative pulse widths. These errors further add to the difficulties of measuring time intervals using the configuration of FIG. 1A.

Measuring high-speed events at the UUT would be simplest if the signal pathway between the UUT and the timer/counter could maintain high bandwidth. Unfortunately, however, maintaining high bandwidth proves to be expensive, particularly if the number of channels 110 is large. As ATE systems commonly include hundreds or even thousands of channels 110, providing high bandwidth between each channel 110 and the timer/counter would excessively raise system cost. Consequently, ATE manufacturers have sought alternatives for measuring high-speed eventsin test systems having low-bandwidth paths.

One alternative to providing high-bandwidth paths would be to include one complete timer/counter within each channel. As timer/counters themselves tend to be expensive, however, it is not feasible to include one timer/counter per channel as part of a reasonably priced ATE system.

Another alternative to providing high bandwidth paths is shown in FIG. 2A. According to FIG. 2A, a tester includes channels 210 that are identical to the channels 110 of FIG. 1A, except that each channel 210 includes a pair of frequency dividers 212 and 214. The frequency dividers 212 and 214 are respectively connected in series with the comparators 124 and 126. As shown in FIG. 2B, the signal 252 at the output of each frequency divider 212, 214 has a period eight times longer than the period of the signal 250 at its input. The substantially longer period of the output signal 252 means that the signal 254 arriving at the timer/counter has more time to settle and thus can be measured more accurately. The arrangement of FIG. 2A thus enables the timer/counter to measure accurately the frequency of test signals from the UUT, even if the bandwidth of the test signals exceeds the bandwidth of the signal path.

Although the configuration of FIG. 2A marks a significant improvement over the configuration of FIG. 1A, it provides limited functionality. Because this technique sends only frequency-divided signals to the timer/counter, the timer/counter cannot measure time intervals between successive edges of an input signal. Nor can the timer/counter measure time intervals from falling edges, or between edges of different slope. Similarly, the timer/counter cannot directly measure pulse widths or single-shot periods using this technique.

SUMMARY OF THE INVENTION

With the foregoing background in mind, it is an object of the invention accurately and easily to measure time intervals between successive edges of high frequency signals.

It is another object of the invention to measure high-frequency time intervals using a relatively low-bandwidth transmission path.

To achieve the foregoing objects and other objectives and advantages, a timing circuit conveys timing relationships of UUT signals to a measurement instrument over a bandwidth-limited pathway. The timing circuit has first and second input nodes, for receiving at least one input signal from the UUT, and first and second output nodes, for connecting to the measurement instrument. The timing circuit includes a frequency divider that has an input coupled to the first input node and an output coupled to the first output node. The timing circuit also includes a clocked memory device that has a first input coupled to the output of the frequency divider and a second input coupled the second input node. The clocked memory device also has an output coupled to the second output node of the timing circuit.

In accordance with another aspect of the invention, a pre-conditioner conveys timing relationships of UUT signals to a measurement instrument. The pre-conditioner has first and second input nodes, for receiving at least one input signal from the UUT, and first and second output nodes, for respectively providing output signals to the measurement instrument. The pre-conditioner is divided into first and second circuit branches. The first circuit branch includes a first frequency divider having an input coupled to the first input node and an output coupled to the first output node. The second circuit branch includes a second frequency divider having an input coupled to the second input node and an output selectably coupled to the second output node. The pre-conditioner further includes a clocked memory device. The clocked memory device has a first input coupled to the output of one of the first and second frequency dividers and a second input coupled to the input of the second frequency divider. The clocked memory device also has an output selectably coupled the second output node.

In accordance with yet another aspect of the invention, a tester for determining whether a UUT is operating properly includes a plurality of channels connectable to the UUT and each including at least one voltage comparator. The tester includes a measurement instrument for measuring timing characteristics of the UUT and a signal pathway for conveying timing signals from the plurality of channels to the measurement instrument. Each of the plurality of channels further includes a pre-conditioner for conveying timing signals between the at least one comparator and the measurement instrument via the signal pathway. The characteristics of the pre-conditioner are set forth in the preceding paragraph.

In accordance with still another aspect of the invention, a method is disclosed for accurately measuring time intervals between first and second timing events at a UUT over a bandwidth-limited pathway. The method includes dividing the frequency of the first timing events to generate a first frequency-divided signal. The edges of the first frequency-divided signal are coincident with alternate first timing events. The method further includes generating a second frequency-divided signal having edges coincident with alternate second timing events. The second frequency-divided signal changes state at most once for each change of state of the first frequency-divided signal, and only after the first frequency-divided signal changes state. In accordance with this aspect of the invention, the first and second frequency-divided signals are conveyed to a measurement instrument. The measurement instrument determines the time interval between the first and second timing events by measuring the time interval between the first and second frequency-divided signals.

Additional objects, advantages and novel features of the invention will become apparent from a consideration of the ensuing description and drawings.

BRIEF DESCRIPTION OF THE DRAWINGS

The invention will be better understood by reference to the following more detailed description and accompanying drawings in which

FIG. 3A is a simplified schematic diagram of a timer/counter pre-conditioner according to the invention;

FIGS. 3B and 3C are timing diagrams of signals within the timer/counter pre-conditioner of FIG. 3, wherein the pre-conditioner is respectively configured for time interval and period measurements;

DETAILED DESCRIPTION OF THE INVENTION

Structure

Figures 1A, 1B:
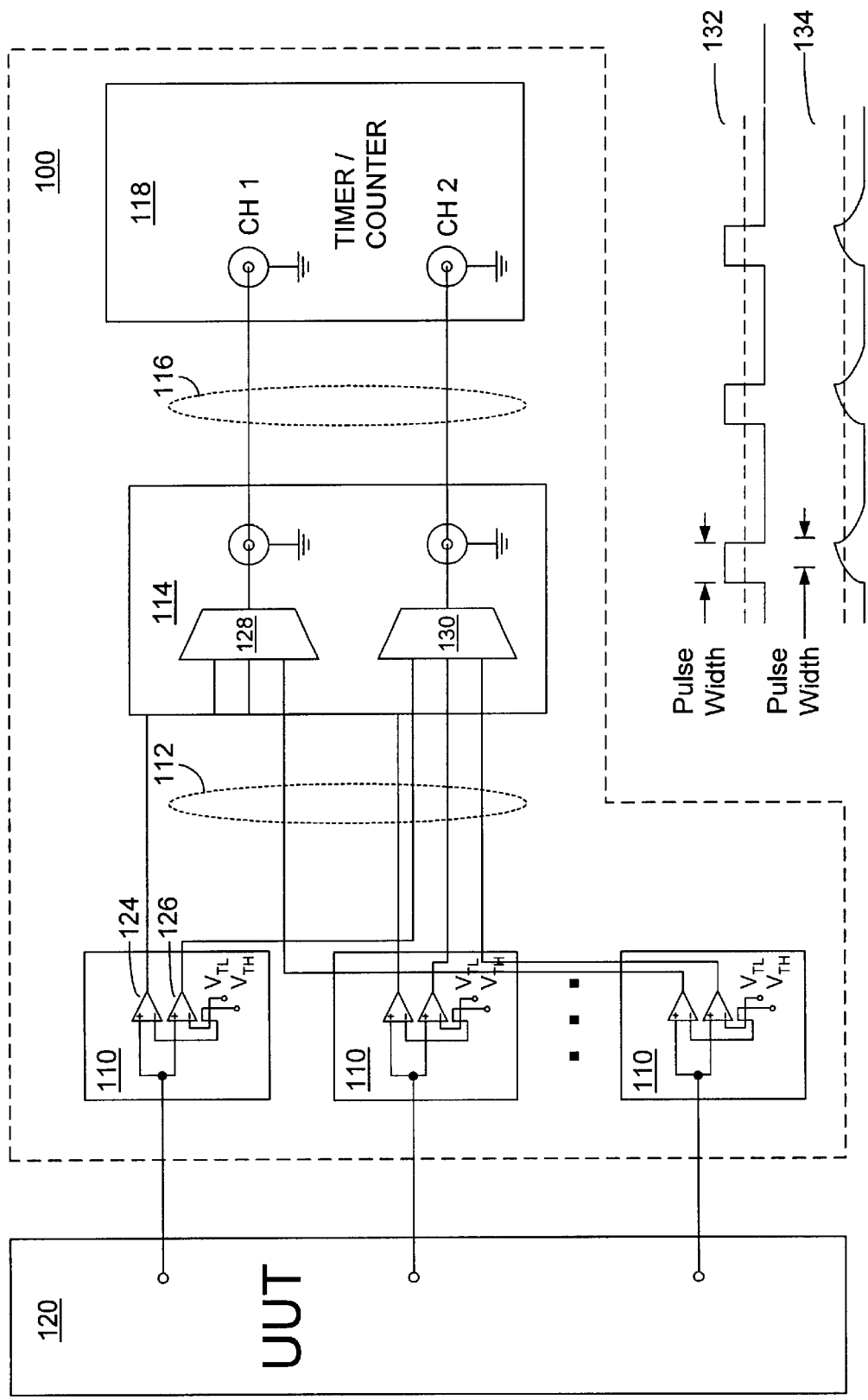
FIGS. 1A and 1B are a block diagram and associated timing diagram of a distributed test system architecture in which time measurements can be made according to the prior art.

FIG. 3A illustrates a timing circuit 300 according to the invention. The timing circuit 300 includes a logic gate 310, for example an AND gate. The AND gate 310 has a first input connected to a first input node 316, and has an output. The timing circuit 300 also includes frequency divider 312 having an input connected to the output of the AND gate 310 an output connected to a first output node 322 of the timing circuit 300.

The timing circuit 300 further includes a clocked memory device 314, for example a flip-flop. The flip-flop has a D input connected to the output of the frequency divider 312 and a CLOCK input connected to a second input node 318 of the timing circuit. The flip-flop 314 also has a Q output connected to a second output node 324 of the timing circuit.

The first and second input nodes 316 and 318 respectively convey first and second input signals to the timing circuit. The first and second output nodes 322 and 324 respectively convey first and second output signals from the timing circuit.

An enable input 320 of the timing circuit called "FRAME" is connected to a reset input of the frequency divider 312 ("R"). It is also connected to a clear input of the flip-flop 314 ("CLR"), and to a second input of the AND gate 310. A FRAME signal conveyed by the FRAME input 320 enables and disables the timing circuit 300, and synchronizes the timing circuit with events at the UUT.

The inclusion of the AND gate 310 in the timing circuit helps to prevent metastability of the frequency divider 312. As is known, metastability can occur if a frequency divider is released from its reset state too closely in time to receiving an active edge at its signal input. The AND gate 310 prevents metastability by holding off changes at the signal input of the frequency divider for one gate delay after FRAME changes, long enough for frequency divider to change from a reset state to an operating state.

Within the ATE system, the first and second input nodes 316 and 318 of the timing circuit 300 are respectively coupled to the outputs of the comparators 124 and 126 (See FIG. 1). The first and second output nodes 322 and 324 of the timing circuit 300 are respectively coupled, through the signal path, to the first and second channels of the timer/counter 118.

Operation

The timing circuit 300 begins to operate when the signal at the FRAME input 320 changes state from low to high. When FRAME goes high, the AND gate 310 allows the first input signal to propagate to the frequency divider 312. Immediately upon receiving a first rising edge of the first input signal after FRAME goes high, the frequency divider 312 generates a first rising edge at the first output signal. The frequency divider 312 generates subsequent rising edges every N rising edges of the input signal thereafter, as long as FRAME remains high. The frequency of the first output signal therefore equals 1/N times the frequency of the first input signal. From the timing circuit 300, the first output signal propagates to the first channel of the timer/counter 118, where it may provide a start event for a time measurement. The first output signal also propagates to the D input of the flip-flop 314. The second input signal propagates to the CLOCK input of the flip-flop 314. Immediately upon a rising edge of the second input signal, the flip-flop 314 clocks the logic level at its D input to its Q output. The Q output propagates to the second output node 324 of the timing circuit 300. From the timing circuit, the second output signal propagates to the second channel of the timer/counter 318, where it may provide a stop event for a time measurement.

The second output signal does not respond to the second input signal until the first output signal changes state, i.e., the Q output of the flip-flop 314 always follows the D input. Therefore, the second output signal changes state a maximum of one time for each change of state of the first output signal. Therefore, the frequency of the second output signal at most equals the frequency of the first output signal—1/N times the frequency of the first input signal. Although the timing circuit reduces the frequencies of the first and second input signals by a factor of N, the positions of the rising edges of the first and second input signals remain intact.

FIG. 3B illustrates timing relationships between input and output signals of the timing circuit 300, for a frequency divider value N equal four. Waveforms 330 and 332 respectively represent the first and second input signals, and waveforms 334 and 336 respectively represent the first and second output signals. As shown in FIG. 3B, the frequency of the first output signal 334 equals one-fourth the frequency of the first input signal 330.

The first output signal 334 goes high immediately upon receiving the first rising edge of the first input signal 330 that follows the assertion of FRAME. It goes high again every N=4 rising edges of the first input signal later, as long as FRAME remains high.

Once the first output signal 334 assumes a high state, the first subsequent rising edge of second input signal 332 clocks the flip-flop 314 and causes the second output signal 336 to assume a high state. Subsequent edges of the second input signal 332 have no effect on the second output signal 336, as long as the first output signal 334 remains high. When the first output signal 334 goes low, the first subsequent rising edge of the second input signal 332 again clocks the flip-flop 314, and causes the second output signal 336 to go low. Subsequent edges of the second input signal 332 have no effect on the second output signal 336, as long as the first output signal remains low.

Figure 2A:
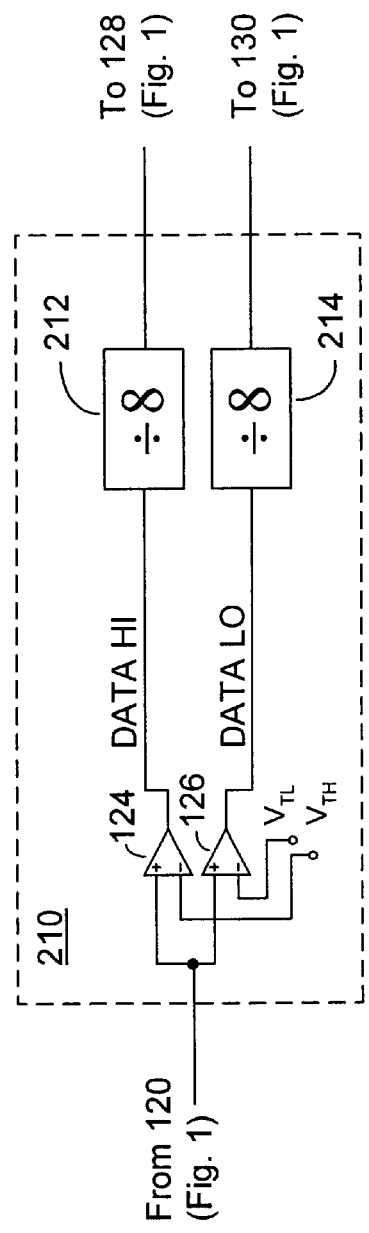
FIGS. 2A and 2B are a block diagram and timing diagram illustrating a prior art improvement to the test system of FIG. 1.
Figure 2B:
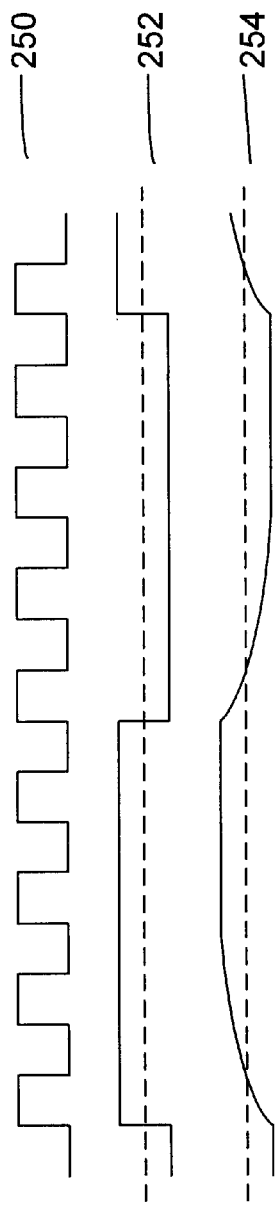

The timing circuit 300 delivers significant advantages over the divider circuit of FIG. 2. Using the timing circuit 300, a timer/counter can determine precisely time intervals between successive rising edges of the input signals 330, 332 by measuring time intervals between rising edges of the output signals 334, 336. The measured intervals are not averaged, or aggregated values taken over N periods of an input signal, but actual, instantaneous time intervals between immediately subsequent rising edges of the first and second input signals 330, 332. This is true although the frequency of the output signals is at least N times slower than the frequency of the first input signal.

Using the timing circuit 300 according to the invention, a timer/counter can measure accurately time intervals, even over a relatively low-bandwidth signal path. Because the timing circuit 300 converts all time-sensitive events at its inputs into rising edges at its outputs, the timer/counter can measure time intervals unaffected by differential delays between rising and falling edges through the signal path. In addition, the timer/counter can measure time intervals unaffected by distortion. Although the signal path distorts the shape of output signals from the timing circuit 300, distortion from any channel to the timer/counter affects only the net delay between the timing circuit 300 and the timer/counter. The effects of distortion can therefore be removed by known techniques for equalizing path delays, such as software calibration or hardware alignment. FIG. 3C illustrates how a timer/counter can use the timing circuit 300 to measure a single-shot period. As shown in FIG. 3C, INPUT1=INPUT2, i.e., a common input signal 350 drives both the first and second input nodes 316 and 318 of the timing circuit 300. The frequency divider 312 generates a first output signal 352, having a frequency equal to one-fourth the frequency of the common input signal 350. The first output signal 352 goes high immediately upon receiving the first rising edge of the common input signal 350 that follows the assertion of FRAME. The output of the frequency divider propagates to the D input of the flip-flop, and the common input signal 350 propagates to the CLOCK input. Because the frequency divider 312 has a finite propagation delay, the edge from the common input signal reaches the flip-flop sooner than the edge from the frequency divider—too soon to clock a new value for the current clock edge. Upon the next rising edge of the common input signal, however, the flip-flop 314 clocks the high level at the D input to the Q output, and the second output signal 354 changes state from low to high. The time between the first rising edge of the first output signal 352 and the first rising edge of the second output signal 354 equals the single-shot period of the common input signal 350. The timer/counter can measure and report this period. Again the result obtained is not an average measurement taken over N periods, but an instantaneous value based upon immediately subsequent rising edges of the input signal.

Implementation

Within the scope of the invention, the construction of the components that make up the timing circuit 300 can varied in a number of ways. For example, the frequency divider 312 can be constructed by cascading a desired number of D flip-flops each configured as divide-by-two circuits. According to this technique, the inverting output of each D flip-flop is connected back to the D input of the flip-flop. An input signal to the circuit drives the CLOCK input of the flip-flop, and an output signal from the circuit is taken from the non-inverting, Q, output. Divide-by-two circuits can be cascaded to achieve a desired division factor by connecting in series the Q output of one stage and the CLOCK input of the next stage. Other ways of constructing the frequency divider 312 are readily known to those skilled in the art.

The logic gate 310 need not necessarily be implemented using an AND gate. Any combination of logic gates or discrete components arranged to provide an AND function can be used. Although the AND gate enhances performance by helping to prevent metastability of the frequency divider 312, it is not essential to the functionality of the timing circuit 300. Therefore, the logic gate 310 can alternatively be omitted altogether.

Polarities of the signals and components can be reversed within the scope of the invention. For example, the AND gate can be replaced with a NAND gate and the frequency divider constructed to respond to falling edges. The frequency divider can be constructed to provide an inverting output signal to the first output node 322, and the flip-flop can be connected to provide its inverting output to the second output node 324. FRAME can be provided as a negative-true logic signal, if the inputs to which it connects are made to respond to a negative-true signal.

The measurement instrument need not necessarily be a timer/counter. Rather, the timing circuit can be used with any instrument or receiving circuit, or in any application in which it is critical to preserve signal edge positions.

The implementation of the clocked memory device 314 need not necessarily be a D flip-flop. Other types of flip-flops or clocked memory devices can be used. Any device capable of generating an output signal that equals, or is the complement of, an input signal, as defined by a clock signal, serves the purposes of the flip-flop 314.

According to one such variation, a counter is used in place of the D flip-flop 314 of FIG. 3A. Thecounter has an ENABLE input and a CLOCK input respectively connected in place of the D input and CLOCK input of the D flip-flop of the timing circuit 300. The counter has an active-low RESET input, connected to the FRAME input 320, and a TERMINAL COUNT output connected in place of the Q output of the D flip-flop. In addition, the counter has a COUNT input that receives a plurality of signals for presetting a counting value, M, and a LOAD COUNT input for clocking the counting value M into the counter.

Prior to operation, the counter is loaded with the counting value M. When ENABLE is low, the counter remains stable, regardless of clock edges at the CLOCK input. After ENABLE goes high, however, the counter counts down one count in response to each subsequent rising edge at its CLOCK input. TERMINAL COUNT goes high immediately upon the clock edge that reduces the counter's value to zero.

If M is preset to one, the counter behaves like the D flip-flop. It generates a rising edge upon the first rising edge of the second input signal that follows a first rising edge of the first output signal after FRAME is asserted. If M is preset to a value greater than one, however, the counter waits until the M-th rising edge of the second input signal before asserting the second output signal. By setting M to various values, the timing circuit 300 can vary the particular rising edge of the second input signal that forms the stop event of a time measurement. The counter can therefore be used to expand the flexibility of the timing circuit 300.

Preferred Embodiment

Figure 4:
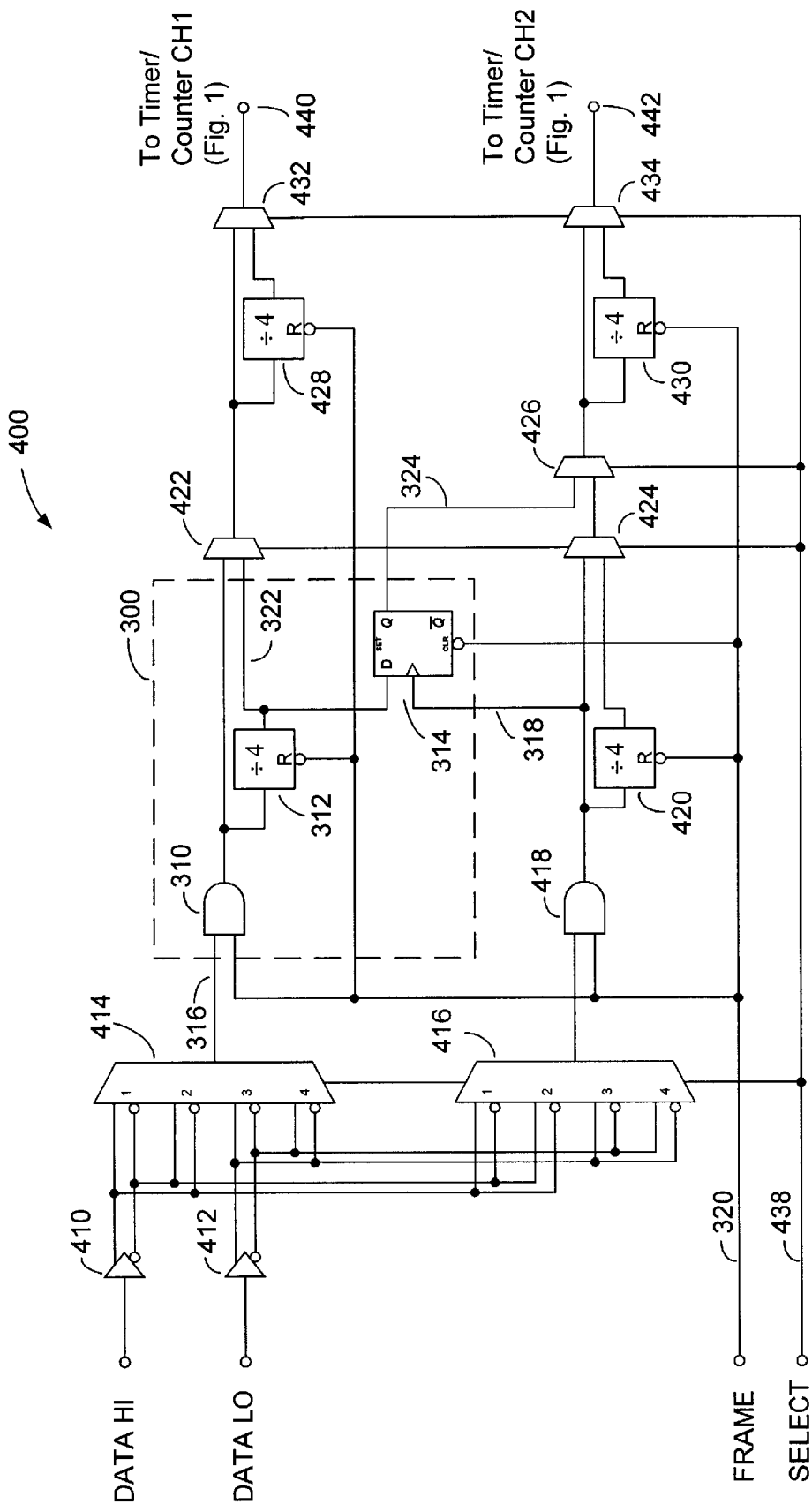
FIG. 4 is a simplified schematic of the preferred embodiment of the timer/counter pre-conditioner according to the invention.

FIG. 4 illustrates the preferred embodiment of the invention. A timer/counter pre-conditioner 400 includes a timing circuit 300, like the one shown in FIG. 3. Within the pre-conditioner 400, the first input node 316 of the timing circuit 300 is coupled to the output of a first multiplexor 414, and the second input node 318 is coupled to the output of a second multiplexor 416. The first and second multiplexors 414 and 416 each have inputs coupled to a pair of input buffers 410 and 412. The input buffers 410 and 412 in turn receive their inputs from the comparators 124 and 126 of a tester channel 110. FIG. 4 identifies the outputs of the comparators 124 and 126 respectively as "DATA HI" and "DATA LO." The buffers 410 and 412 can alternatively be omitted, and the outputs of the comparators connected directly to the multiplexors 414 and 416.

The pre-conditioner 400 preferably employs buffers 410, 412 and multiplexors 414, 416 having differential construction, to maintain accurate timing between the comparators 124, 126 and the timing circuit 300. Alternatively, the pre-conditioner 400 employs single-ended input buffers and multiplexors in less critical applications.

As with the timing circuit 300, the FRAME input 320 enables and disables the pre-conditioner 400, and synchronizes its operations. The pre-conditioner 400 also includes a SELECT input 438. The SELECT input conveys a plurality of control signals to the multiplexors of the pre-conditioner to flexibly configure them for various modes of operation.

The pre-conditioner 400 expands the capabilities of the timing circuit 300. It provides rising edges to the inputs of the timing circuit 300 in response to both rising and falling edges at DATA HI and DATA LO. The pre-conditioner 400 buffersnrising edges at DATA HI and DATA LO and passes them directly to the timing circuit. It converts falling edges into rising edges by inverting (crossing) the differential inputs to a multiplexor 414, 416. Specifically, each input multiplexor has four differential inputs, numbered 1–4, which respectively provide a rising edge to the timing circuit 300 in response to the following conditions:

1. a rising edge of DATA HI
2. a falling edge of DATA HI
3. a rising edge of DATA LO
4. a falling edge of DATA LO.

The pre-conditioner 400 also includes a second frequency divider 420 and a second AND gate 418. The second frequency divider 420 divides the frequency of a signal from the second multiplexor 416 to mirror the division of the signal from the first multiplexor 414 by the first frequency divider 312. Preferably, the first and second frequency dividers 312 and 420 have the same divider factor N, to supply comparable signals to the two channels of the timer/counter.

The pre-conditioner 400 still further includes a second AND gate 418. The second AND gate 418 helps to prevent metastability of the second frequency divider 420, in the same manner described above for the first AND gate 310. The first and second AND gates 310 and 418 perform a second function as well in the embodiment of FIG. 4—they gate signals from the first and second multiplexors 414, 416 to the outputs of the pre-conditioner. As described below, the pre-conditioner 400 can be configured to directly supply its input signals to its outputs without frequency division. Under these circumstances, the AND gates 310 and 418 selectively pass and block input signals to the outputs of the pre-conditioner, in response to FRAME.

The pre-conditioner 400 always conveys the first output signal of the timing circuit 300 to the first channel of the timer/counter. It can convey either of two signals, however, to the second channel of the timer/counter—the second output signal of the timing circuit or the output of the second frequency divider 420. The pre-conditioner 400 can thus assume two distinct modes. In the first mode, the pre-conditioner generates immediately subsequent edges of the timing circuit's inputs for critical edge-to-next-edge measurements. In the second mode, the pre-conditioner operates as a pair of simple dividers.

A bridging multiplexor 426 selects between the first and second modes. The bridging multiplexor has a first input connected to the Q output of the flip-flop 314 and a second input connected to the output of the second frequency divider 420. The output of the bridging multiplexor is coupled to the second channel of the timer/counter. In response to control from SELECT, the bridging multiplexor 426 connects either of its inputs to its output, and therefore selects one of the first and second modes.

The timer/counter pre-conditioner 400 also includes third and fourth frequency dividers 428 and 430 to further divide the frequencies of signals to the timer/counter. The third and fourth frequency dividers 428 and 430 can be used for exceptionally high-frequency input signals, as well as for very low-bandwidth signal paths between the pre-conditioner and the timer/counter. The divider factor of the third and fourth frequency dividers is shown to be four; however, this value can be varied to suit individual circumstances.

For added flexibility, the pre-conditioner includes bypass multiplexors 422, 424, 432, and 434 to selectably jumper over each of the frequency dividers 312, 420, 428, and 430 of the pre-conditioner 400. Bypass multiplexors preferably operate in pairs. For example, multiplexors 422 and 424 operate together, both either passing or bypassing the frequency divider to which it is connected. Multiplexors 432 and 434 operate together in a similar fashion. When a division factor of four is used for each of the frequency dividers 312, 420, 428, and 430, the pre-conditioner 400 can divide input frequencies by either 1, 4, or 16.

As an alternative to providing two pairs of frequency dividers each having a discrete division factor, a single pair of variable frequency dividers can be used. Variable frequency dividers can be programmed to provide a wide range of frequency divisions suitable for measuring various time intervals. If fixed frequency dividers are used, division factors should be selected in accordance with expected testing conditions, with consideration given to the expected range of input frequencies and the bandwidth of the signal path to the timer/counter. More stages of frequency dividers and bypass multiplexors can be included, as desired.

The timer/counter pre-conditioner 400 according to the invention greatly enhances the ability of an ATE system to measure accurate time intervals over a relatively low-bandwidth path. Using the pre-conditioner 400, the timer/counter can measure edge-to-next-edge time intervals from DATA HI or DATA LO. It can measure time intervals between any two consecutive edges of a single input signal, or can measure time intervals between a first edge of one input signal and a next edge of the other input signal. Using the pre-conditioner 400, the timer/counter can measure time intervals for all edge combinations-rising-to-rising, falling-to-falling, rising-to-falling, and falling-to-rising. Either DATA HI or DATA LO can start a time measurement, and either can stop a time measurement.

In addition to edge-to-next-edge measurements, the pre-conditioner 400 can output its input signals directly to the timer/counter, or can output simple divisions of its input signals.

The timer/counter pre-conditioner 400 is preferably manufactured as part of an Application Specific Integrated Circuit (ASIC), in which it can operate at data rates exceeding 2.5 Giga-bits per second. The pre-conditioner 400 is not limited, however, to an ASIC implementation. Because its consists of readily available logic, the pre-conditioner 400 can also be constructed from discrete devices, or as part of a Field Programmable Gate Array (FPGA).

Alternatives

Figure 5:
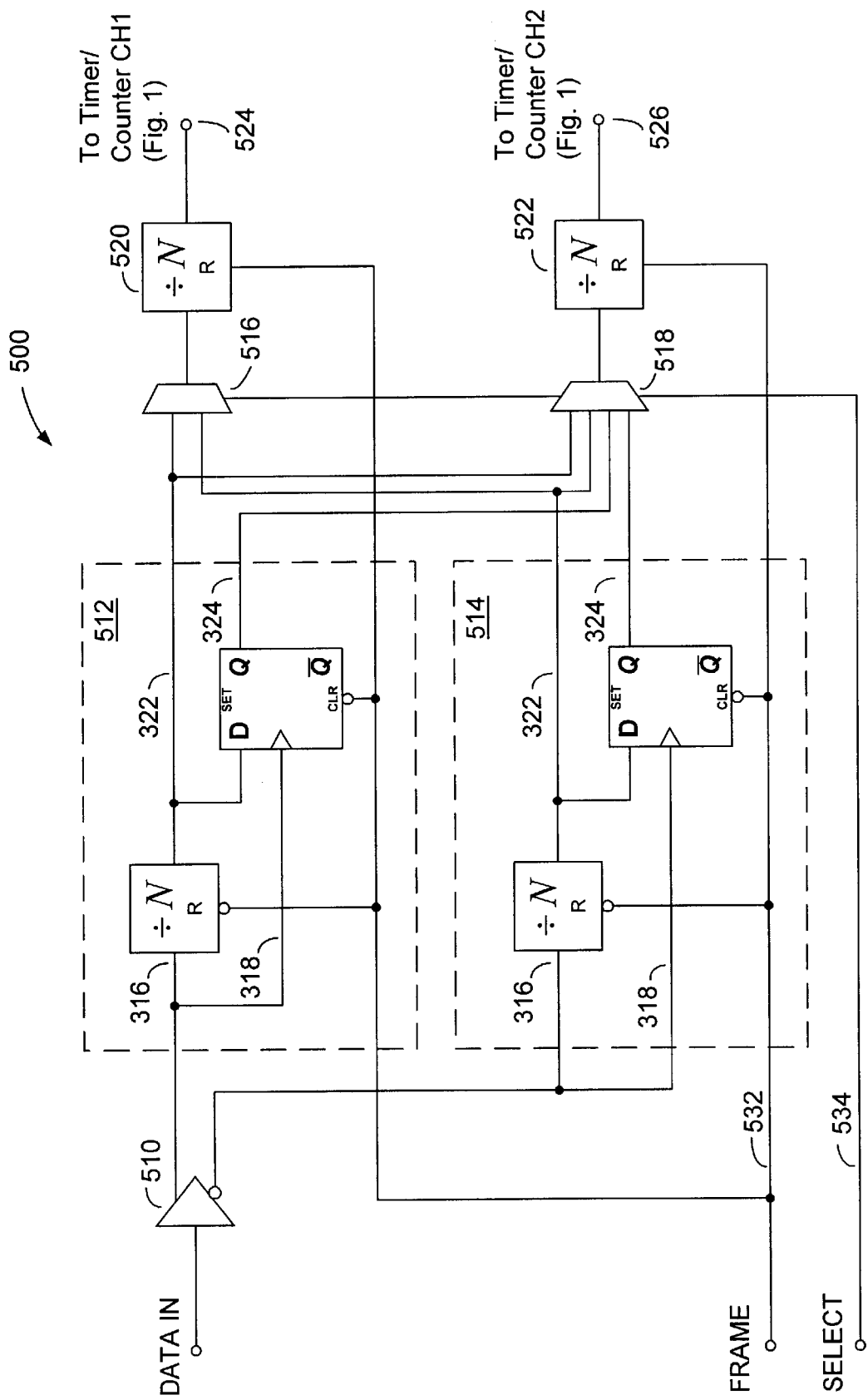
FIG. 5 is a simplified schematic of an alternate embodiment of the timer/counter pre-conditioner according to the invention.

Having described one embodiment, numerous alternative embodiments or variations might be made. For example, FIG. 5 illustrates an alternative embodiment of the invention, in which a pre-conditioner 500 includes two separate timing circuits 512 and 514. The timing circuits 512 and 514 are similar to the timing circuit 300 of FIG. 3. The first and second input nodes 316 and 318 of each of the timing circuits 512, 514 connect together at a common input node. A differential buffer 510 receives an input signal DATA IN from a channel 110. The differential buffer 510 has non-inverting and inverting output nodes respectively coupled to the common input nodes of the first and second timing circuits 512 and 514.

During operation, the first timing circuit 512 responds to rising edges of DATA IN, and the second timing circuit 514 responds to falling edges of DATA IN. Because the first and second input nodes 316 and 318 of each timing circuit 512, 514 are connected together, the timing circuits 512, 514 behave in a manner similar to that described above for FIG. 3c. Each rising edge at the second output node 324 of either of the timing circuits 512, 514 always occurs exactly one period after the first rising edge at the first output node 322 of the timing circuit.

The pre-conditioner 500 also includes a first output multiplexor 516 and a second output multiplexor 518. The first output multiplexor 516 selectably switches the first output node 322 of each timing circuit 512, 514 to the first channel of the timer/counter. The second output multiplexor 518 switches the same signals to the second channel of the timer/counter. The second multiplexor 518 also can switch the second output node 324 of both timing circuits 512, 514 to the second channel of the timer/counter.

The pre-conditioner 500 further includes third and fourth frequency dividers 524 and 526, respectively coupled in series with the outputs of the output multiplexors 516, 518. The third and fourth frequency dividers further reduce the frequencies of signals sent to the timer/counter, to allow the timer/counter to measure even higher frequency signals.

The pre-conditioner 500 can be flexibly configured to measure a wide range of time intervals in an ATE system 100. For example, with the outputs 322, 324 of the first timing circuit 512 switched to the outputs 524, 526 of the pre-conditioner 500, the timer/counter can measure single-shot periods between consecutive rising edges of DATA IN. Similarly, with both outputs of the second timing circuit 514 switched to the outputs of the pre-conditioner 500, the timer/counter can measure single-shot periods between consecutive falling edges of DATA IN. The timer/counter can measure an averaged period of DATA IN from the first output node 322 of either timing circuit. It can also measure the pulse width of DATA IN. Pulse width can be measured as the interval between the first output signal of one timing circuit and the second output signal of the other timing circuit. For measuring positive pulses, the first timing circuit 512 starts the interval. For measuring negative pulses, the second timing circuit 514 starts the interval.

It should be understood, therefore, that the particular implementation of the invention disclosed herein could be widely varied by those skilled in the art within the scope of the invention. Therefore, the invention should be limited only by the spirit and scope of the appended claims.

What is claimed is:

1. A timing circuit for conveying timing relationships of signals of a unit under test (UUT) over a bandwidth-limited pathway to a measurement instrument, comprising:

first and second input nodes for receiving at least one signal from the UUT;

first and second output nodes for respectively providing first and second output signals to the measurement instrument;

a frequency divider having an input coupled to the first input node and an output coupled to the first output node; and a clocked memory device having a first input coupled to the output of the frequency divider, a second input coupled the second input node, and an output coupled to the second output node.

2. The timing circuit of claim 1, wherein the clocked memory device is a D flip-flop, the first input of the flip-flop being a D input and the second input being a CLOCK input.

3. The timing circuit of claim 2, wherein the frequency divider is a first frequency divider, the timing circuit further comprising:

a first multiplexor having first and second inputs and an output, the first and second inputs respectively coupled to the input and output of the first frequency divider;

a second frequency divider having an input coupled to the output of the first multiplexor and an output; and a second multiplexor having first and second inputs respectively coupled to the input and output of the second frequency divider, and an output coupled to the first output node.

4. The timing circuit of claim 2, further comprising a multiplexor having first and second inputs respectively coupled to the D input and the output of the D flip-flop, and an output coupled to the second output node.

5. The timing circuit of claim 4, wherein the frequency divider is a first frequency divider, the timing circuit further comprising:
   a second frequency divider having an input coupled to the output of the first frequency divider and an output coupled to the first output node; and
   a third frequency divider coupled in series between the output of the multiplexor and the second output node.

6. The timing circuit of claim 1, wherein the clocked memory device is a counter, the first input of the clocked memory device being an ENABLE input and the second input being a CLOCK input.

7. The timing circuit of claim 1, further comprising a FRAME input coupled to a reset input of the clocked memory device and to a reset input of the frequency divider, wherein the timing circuit responds to the first and second input signals only when the FRAME input is active.

8. The timing circuit of claim 1, wherein the frequency divider has a RESET input, and further comprising:
   a logic gate coupled in series between the first input node and the frequency divider, having a first input coupled to the first input node and an output coupled to the input of the frequency divider; and
   a FRAME input, coupled to a second input of the logic gate and to the RESET-input of the frequency divider.

9. The timing circuit of claim 8, wherein:
   the logic gate comprises an AND gate, and
   the clocked memory device is a D flip-flop, the first input of the clocked memory device being a D input and the second input being a CLOCK input.

10. A pre-conditioner for conveying timing relationships of signals over a bandwidth-limited pathway between a unit under test (UUT) and a measurement instrument, comprising:
    first and second input nodes for receiving at least one input signal from the UUT;
    first and second output nodes for respectively providing first and second output signals to the measurement instrument;
    a first circuit branch including a first frequency divider having an input coupled to the first input node and an output coupled to the first output node;
    a second circuit branch including a second frequency divider having an input coupled to the second input node and an output selectably coupled to the second output node; and
    a clocked memory device having a first input coupled to the output of one of the first and second frequency dividers, a second input coupled to the input of the second frequency divider, and an output selectably coupled the second output node.

11. The pre-conditioner of claim 10, further comprising a FRAME input coupled to a reset input of the clocked memory device and to a reset input of the first frequency divider, wherein the pre-conditioner responds to the first and second input signals only when the FRAME input is active.

12. The pre-conditioner of claim 10, wherein the clocked memory device is a D flip-flop, the first input of the clocked memory device being a D input and the second input being a CLOCK input.

13. The pre-conditioner of claim 12, wherein the D flip-flop is a first D flip-flop and the D input is coupled to the output of the second frequency divider, the pre-conditioner further comprising:
    a differential driver having an input that receives the at least one input signal from the UUT, a non-inverting output coupled to the first input node, and an inverting output coupled to the second input node;
    a second D flip-flop having a D input and a CLOCK input respectively coupled to the output and input of the first frequency divider;
    a first multiplexor having first and second inputs respectively coupled to the outputs of the first and second frequency dividers and an output coupled to the first output node; and
    a second multiplexor having first and second inputs respectively coupled to the outputs of the first and second frequency dividers, third and fourth inputs respectively coupled to the outputs of the first and second D flip-flops, and an output coupled to the second output node.

14. The pre-conditioner of claim 13, further comprising:
    a third frequency divider coupled in series between the output of the first multiplexor and the first output node; and
    a fourth frequency divider coupled in series between the output of the second multiplexor and the second output node.

15. The pre-conditioner of claim 12, wherein the D input of the D flip-flop is coupled to the output of the first frequency divider.

16. The pre-conditioner of claim 15, further comprising:
    a multiplexor having a first input coupled to the output of the second frequency divider, a second input coupled to the output of the D flip-flop, and an output coupled to a second output node.

17. The pre-conditioner of claim 16, wherein the multiplexor is a first multiplexor, and further comprising:
    a second multiplexor having first and second inputs respectively coupled to the input and output of the first frequency divider, for selectively bypassing the first frequency divider; and
    a third multiplexor having first and second inputs respectively coupled to the input and output of the second frequency divider, for selectively bypassing the second frequency divider.

18. The pre-conditioner of claim 17, further comprising:
    a third frequency divider coupled in series between the output of the second multiplexor and the first output node; and
    a fourth frequency divider coupled in series between the output of the third multiplexor and the second output node.

19. The pre-conditioner of claim 18, each circuit branch further comprising:
    an input multiplexor having a plurality of inputs that receive the at least one input signal from the UUT and complements of the at least one input signal, and having an output coupled to the respective frequency divider of the circuit branch.

20. The pre-conditioner of claim 19, wherein the first and second frequency dividers each include a RESET input, and further comprising, in each circuit branch,
    a logic gate coupled in series between the input multiplexor and the respective frequency divider, having a first input coupled to the output of the input multiplexor and an output coupled to the input of the respective frequency divider; and a FRAME input, coupled to a second input of the logic gate and to the RESET input of the respective frequency divider.

21. The pre-conditioner of claim 20, wherein the logic gate comprises an AND gate.

22. A tester for determining whether a unit under test (UUT) is operating properly, comprising:

a plurality of channels connectable to the UUT and each including at least one voltage comparator;

a measurement instrument for measuring timing characteristics of the UUT; and a signal pathway conveying timing signals from the plurality of channels to the measurement instrument, wherein each of the plurality of channels further includes a pre-conditioner for conveying timing signals between the at least one comparator and the measurement instrument via the signal pathway, the pre-conditioner comprising first and second input nodes for receiving at least one signal from the UUT;

first and second output nodes for respectively providing first and second output signals to the measurement instrument;

a first circuit branch including a first frequency divider having an input coupled to the first input node and an output coupled to the first output node;

a second circuit branch including a second frequency divider having an input coupled to the second input node and an output selectably coupled to the second output node; and a clocked memory device having a first input coupled to the output of one of the first and second frequency dividers, a second input coupled to the input of the second frequency divider, and an output selectably coupled the second output node.

23. The pre-conditioner of claim 22, further comprising a FRAME input coupled to a reset input of the clocked memory device and to a reset input of the first frequency divider, wherein the pre-conditioner responds to the first and second input signals only when the FRAME input is active.

24. The pre-conditioner of claim 22, wherein the clocked memory device is a D flip-flop, the first input of the flip-flop being a D input and the second input being a CLOCK input.

25. In an electronic test system, a method for accurately measuring time intervals between first and second timing events at a unit under test (UUT) over a bandwidth-limited pathway, comprising:

(a) dividing the frequency of the first timing events to generate a first frequency-divided signal, the first frequency-divided signal having a first edge coincident with an initial first timing event and subsequent edges of the same polarity as the first edge coincident with every Nth first timing event thereafter;

(b) generating a second frequency-divided signal having edges coincident with second timing events and changing state at most once for each change of state of the first frequency-divided signal only after the first frequency-divided signal changes state;

(c) conveying the first and second frequency-divided signals a measurement instrument; and (d) determining the time interval between the first and second timing events by measuring a time interval between the first and second frequency-divided signals.

26. The method of claim 25, further comprising:

generating timing signals representative of the first and second timing events; and generating timing signals representative of the complements of the first and second timing events.

27. The method of claim 26, further comprising:

selecting from among the timing signals and the complements of the timing signals to provide signals from which the first and second frequency-divided signals are generated.

28. The method of claim 25, further comprising controllably activating the method in response to a FRAME signal, the initial first timing event being the first event that occurs after the FRAME signal activates.

29. The method of claim 28, further comprising activating the FRAME signal to capture a desired sequence of events at the UUT.

30. The method of claim 25, wherein the edges of the first and second frequency-divided signals that are respectively coincident with the first and second timing signals have the same polarity.

* * * * *